US006297164B1

(12) United States Patent
Khoury et al.

(10) Patent No.: US 6,297,164 B1
(45) Date of Patent: *Oct. 2, 2001

(54) METHOD FOR PRODUCING CONTACT STRUCTURES

(75) Inventors: Theodore A. Khoury, Chicago; Mark R. Jones, Mundelein; James W. Frame, Chicago, all of IL (US)

(73) Assignee: Advantest Corp., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/201,299

(22) Filed: Nov. 30, 1998

(51) Int. Cl.[7] .................................................. H01L 21/302
(52) U.S. Cl. .......................... 438/708; 438/720; 438/723
(58) Field of Search ..................... 438/720, 734, 438/742, 749, 750, 754, 708, 723; 216/20, 33, 52

(56) References Cited

U.S. PATENT DOCUMENTS

| | | | |
|---|---|---|---|
| 4,604,160 | * | 8/1986 | Murakami et al. ..................... 216/18 |
| 4,705,592 | * | 11/1987 | Bahrle et al. ........................... 216/18 |
| 5,028,513 | * | 7/1991 | Murakami et al. .................. 430/315 |
| 5,286,335 | * | 2/1994 | Drabik et al. ........................ 438/479 |
| 5,465,009 | * | 11/1995 | Drabik et al. ........................ 257/723 |
| 5,486,483 | * | 1/1996 | Lammert ............................... 438/666 |
| 5,527,766 | * | 6/1996 | Eddy ..................................... 505/410 |
| 5,538,922 | * | 7/1996 | Cooper et al. ....................... 438/634 |
| 5,607,818 | * | 3/1997 | Akram et al. ........................ 430/311 |

* cited by examiner

Primary Examiner—Benjamin L. Utech
Assistant Examiner—Binh X Tran
(74) Attorney, Agent, or Firm—Muramatsu & Associates

(57) ABSTRACT

A production method for forming contact structures on a planar surface of a substrate and removing therefrom to mount the contact structures on a contact substrate. The contact structure is formed of a base beam which is attached to a surface of the contact substrate in a vertical direction, a horizontal beam which is connected to the base beam at one end, and a top beam formed on another end of the horizontal beam and is oriented in the vertical direction. The production method includes the steps of forming a sacrificial layer on a silicon substrate, forming, exposing and developing a photoresist layer, depositing conductive material on the photoresist layer to form the contact structures, and removing the photoresist layer and the sacrificial layer to separate the contact structures from the silicon substrate.

19 Claims, 8 Drawing Sheets

METHOD FOR PRODUCING CONTACT STRUCTURES

FIELD OF THE INVENTION

This invention relates to a method for producing contact structures, and more particularly, to a method for producing a large number of contact structures on a semiconductor wafer in a horizonal direction and removing the contact structures from the wafer to be mounted on a probe card, IC chip, or other contact mechanism in a vertical direction.

BACKGROUND OF THE INVENTION

In testing high density and high speed electrical devices such as LSI and VLSI circuits, a high performance probe card having a large number of contact structures must be used. In other application, contact structures may be used for IC packages as IC leads. The present invention is directed to a production process of such contact structures to be used in testing LSI and VLSI chips, semiconductor wafers, burn-in of semiconductor wafers and die, testing and burn-in of packaged semiconductor devices, printed circuit boards and the like, as well as used in forming leads of IC chips or IC packages.

The inventors of this application have proposed a new type of contact structure to be used in such applications noted above in U.S. patent application Ser. No. 09/099,614 filed Jun. 19, 1998, entitled "Probe Contactor Formed by Photolithography Process", U.S. patent application Ser. No. 09/140,961 filed Aug. 27, 1998, entitled "High Performance Integrated Circuit Chip Package", and U.S. patent application Ser. No. 09/157,842 filed Sept. 21, 1998, entitled "Packaging and Interconnection of Contact Structure". This invention is directed to a method of producing the contact structures shown in such patent applications.

In the above noted patent applications, the inventors have proposed a unique type of contact structures as shown in FIG. 1. The example of FIG. 1 shows the application in which contact structures 30 are mounted on a contact substrate such as a probe card to electrically contact the targets such as contact pads 320 on a printed circuit board 300. The contact structures 30 are formed through a photolithography process on a semiconductor substrate 20, which is fully described in the above patent applications.

Although the production methods introduced in the above noted patent applications appear to be successful, the methods require relatively many lithography steps to form the structure in a vertical direction on the substrate. The inventors have attained a more simplified and low cost production process which is also able to achieve contact structures of higher reliability because of the simplified production process.

SUMMARY OF THE INVENTION

Therefore, it is an object of the present invention to provide a method for producing a large number of contact structures by using relatively simple technique.

It is another object of the present invention to provide a method for producing a large number of contact structures in a two dimensional manner rather than a three dimensional manner on a planar surface of a silicon substrate.

It is a further object of the present invention to provide a method for producing a large number of contact structures in a two dimensional manner on a silicon substrate, removing the contact structures from the substrate to be mounted on a probe card or other contact mechanism in a three dimensional manner.

It is a further object of the present invention to provide a method for producing a large number of contact structures with low cost and high efficiency.

It is a further object of the present invention to provide a method for producing a large number of contact structures of high mechanical strength and reliability.

It is a further object of the present invention to provide a method of producing contact structures to be used in testing and burn-in semiconductor wafers, packaged LSIs and the like.

In the present invention, contact structures for testing (including burn-in) a semiconductor wafers, packaged LSIs or printed circuit boards (devices under test) are formed on a planar surface of a silicon substrate by a photolithography technology established in the semiconductor production process.

The production method of the present invention is comprised of the steps of:

(a) forming a sacrificial layer on a surface of a silicon substrate;
(b) forming an conductive layer made of electric conductive material on the sacrificial layer;
(c) forming a photoresist layer on the conductive layer;
(d) aligning a photo mask over the photoresist layer and exposing the photoresist layer with ultraviolet light through the photo mask, the photo mask including an image of the contact structures;
(e) developing the image on the photoresist layer which has openings on the surface of the photoresist layer;
(f) forming the contact structures made of electric conductive material in the openings by an electroplating process;
(g) stripping the photoresist layer;
(h) removing the sacrificial layer by a first etching process so that the contact structures are separated from the silicon substrate; and
(i) removing the conductive layer from the contact structure by a second etching process.

Another aspect of the present invention is a process of producing a contact mechanism having contact structures each of which is able to exhibit a spring force for establishing electrical contact with a contact target. The production process is comprised of the following steps of:

(a) forming a sacrificial layer on a surface of a silicon substrate;
(b) forming an conductive layer made of electric conductive material on the sacrificial layer;
(c) forming the contact structures through a photolithography process, the contact structures being in a horizontal directions on the silicon substrate;
(d) removing the contact structures from the silicon substrate and from the conductive layer;
(e) aligning and orienting the contact structures in a predetermined direction;
(f) positioning the contact mechanism having bonding locations for mounting the contact structures thereon; and
(g) picking at least one of the contact structures and placing the same on a predetermined position on a bonding pad of the contact mechanism and bonding the contact structure to the bonding pad.

DETAILED DESCRIPTION OF THE PREFERRED EMBODIMENT

Figure 1:
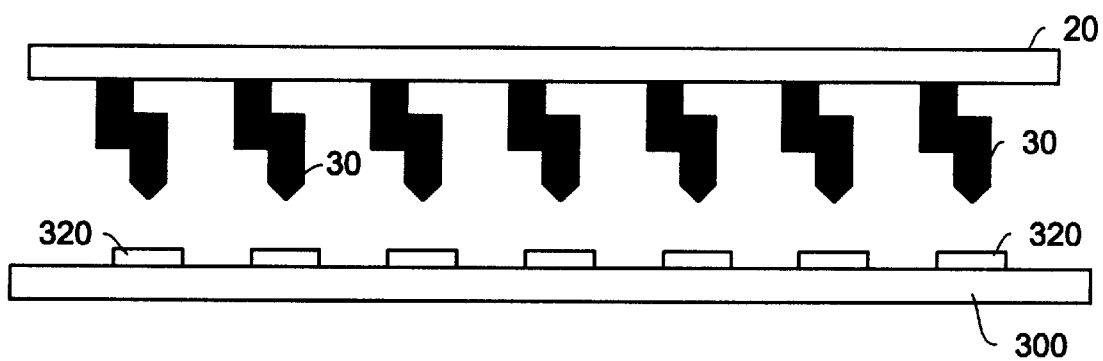
FIG. 1 is a schematic diagram showing a structural relationship between a probe card mounting contact structures and contact targets such as a semiconductor wafer.

Each of the contact structures 30 of FIG. 1 produces contact pressure by a spring force derived mainly from a horizontal beam thereof when the contact structure is pressed against a contact pad 320 on the printed circuit board 300. The contact pressure also creates a scrubbing effect at the tip of the contact structure against the surface of contact pad 320. The contact structures may take various shapes such as shown in FIGS. 6A–6F.

Figure 2A:
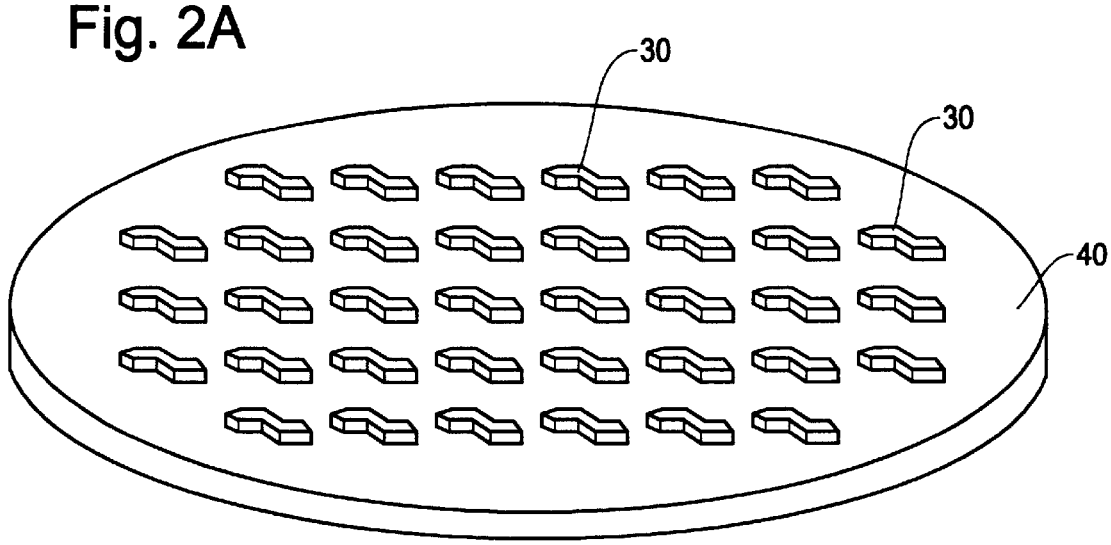
FIGS. 2A and 2B are schematic diagrams showing a basic idea of production method of the present invention in which a large number of contact structures are formed on a planar surface of a silicon substrate and removed therefrom.
Figure 2B:
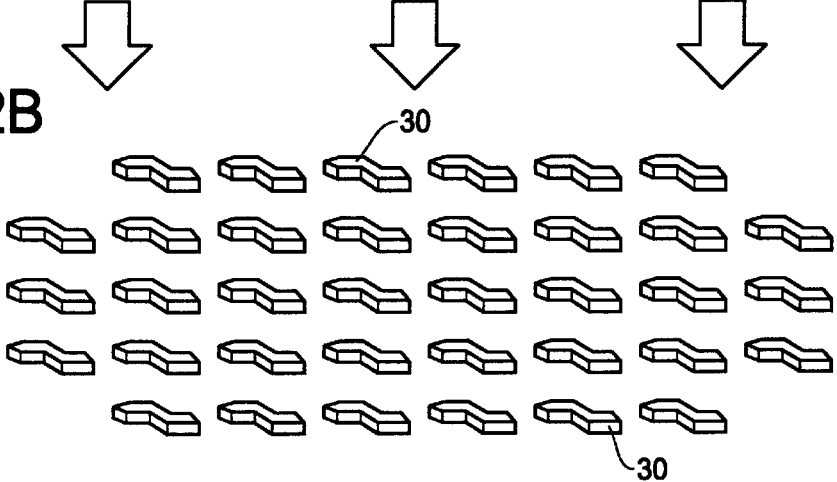

FIG. 2 shows a basic idea of the present invention for producing such contact structures. In the present invention, as shown in FIG. 2A, contact structures are produced on a planar surface of a silicon substrate in a horizontal direction, i.e., in a two dimensional manner. Then, as shown in FIG. 2B, the contact structures are removed from the substrate to be mounted on a contact substrate such as a printed circuit board, IC chip, or other contact mechanism in a vertical direction, i.e., in a three dimensional manner.

Figure 3A:
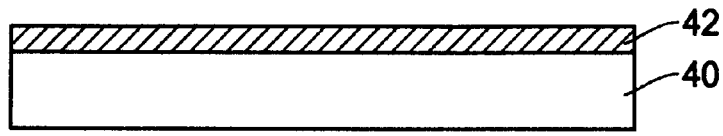
FIGS. 3A–3L are schematic diagrams showing an example of production process of the present invention for producing the contact structures.

FIGS. 3A–3L are schematic diagrams showing an example of production process for producing the contact structure of the present invention. In FIG. 3A, a sacrificial layer 42 is formed on a silicon substrate 40. The sacrificial layer 42 is made, for example, of silicon dioxide ($SiO_2$) through a deposition process such as a chemical vapor deposition (CVD). The sacrificial layer 42 is to separate the contact structure from the silicon substrate in the later stage of the production process.

Figure 3B:
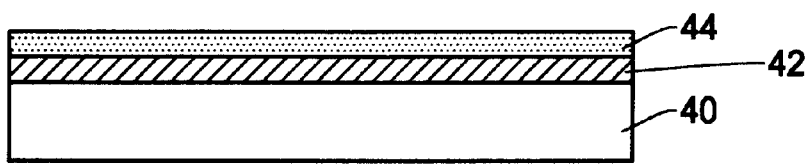
Figure 3C:
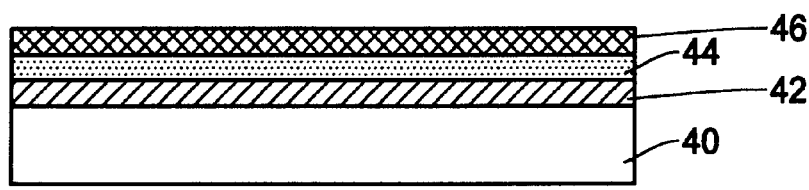

An adhesion promoter layer 44 is formed on the sacrificial layer 42 as shown in FIG. 3B through, for example, an evaporation process. An example of material for the adhesion promoter layer 44 includes chromium (Cr) and titanium (Ti) with a thickness of 200–1,000 angstrom. The adhesion promoter layer 44 is to facilitate the adhesion of a conductive layer 46 of FIG. 3C on the silicon substrate 40. The conductive layer 46 is made, for example, of copper (Cu) or nickel (Ni), with a thickness of 1,000–5,000 angstrom. The conductive layer 46 is to establish electrical conductivity for an electroplating process in the later stage.

Figure 3D:
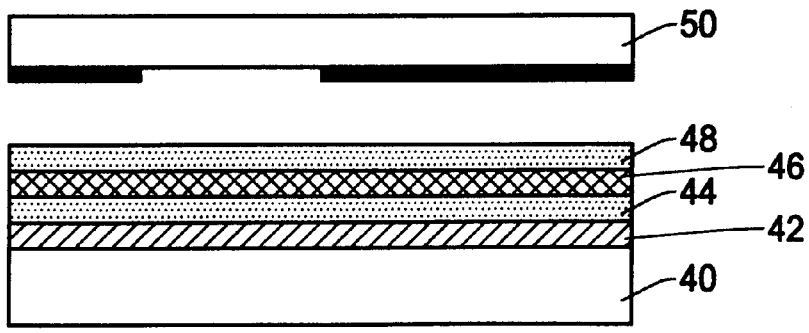
Figure 3E:
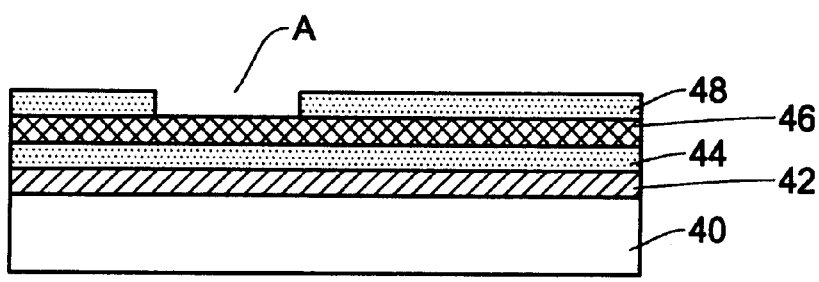
Figure 3F:
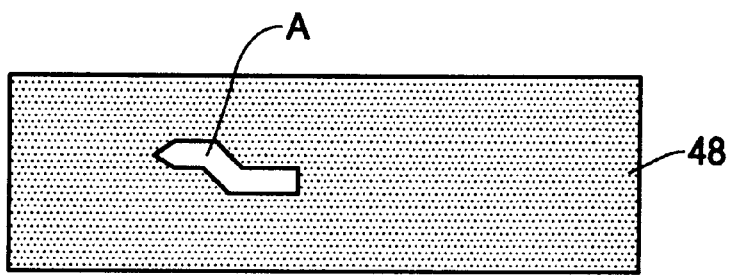

In the next process, a photoresist layer 48 is formed on the conductive layer 46 over which a photo mask 50 is precisely aligned to be exposed with ultraviolet (UV) light as shown in FIG. 3D. The photo mask 50 shows a two dimensional image of the contact structure 30 which will be developed on the photoresist layer 48. As is well known in the art, positive as well as negative photoresist can be used for this purpose. If a positive acting resist is used, the photoresist covered by the opaque portions of the mask 50 harden (cure) after the exposure. Examples of photoresist material include Novolak (M-Cresol-formaldehyde), PMMA (Poly Methyl Methacrylate), SU-8 and photo sensitive polyimide. The exposed part of the resist can be dissolved and washed away, leaving a photoresist layer 48 of FIG. 3E having an opening A (development process). FIG. 3E is a top view showing the photoresist layer 48 of FIG. 3F wherein the opening A having the shape of the contact structure 30 is shown.

In the photolithography process in the foregoing, instead of the UV light, it is also possible to expose the photoresist layer 48 with an electron beam or X-rays as is known in the art. Further, it is also possible to directly write the image of the contact structure on the photoresist layer 48 by exposing the photoresist 48 with a direct write electron beam, X-ray or light source (laser).

Figure 3G:
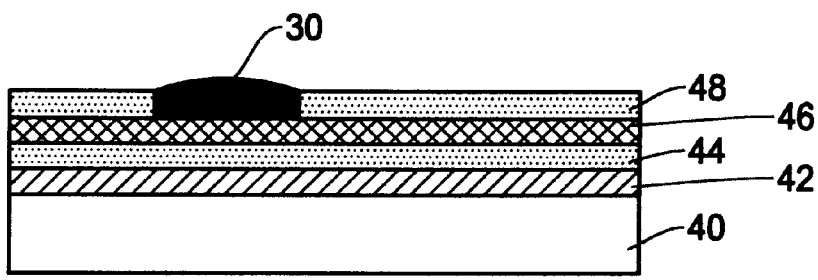
Figure 3H:
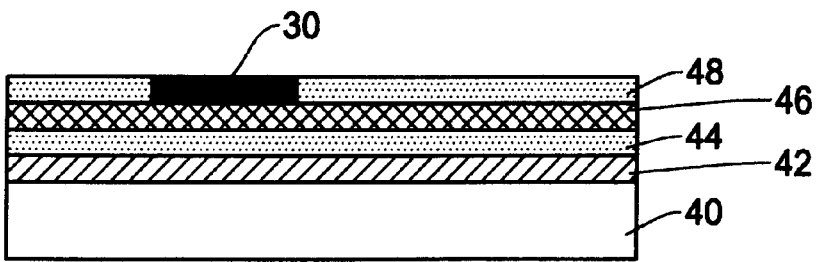

The contactor material such as copper (Cu), nickel (Ni), aluminum (Al), rhodium (Rh), palladium (Pd), tungsten (W) or other metal is deposited (electroplated) in the opening A of the photoresist layer 48 to form the contact structure 30 as shown in FIG. 3G. It can be beneficial for the contact material to be different from that of the conductive layer 46 to differentiate etching characteristics from one another as will be described later. The over plated portion of the contact structure 30 in FIG. 3G can be taken out in the grinding (planarizing) process of FIG. 3H.

Figure 3I:
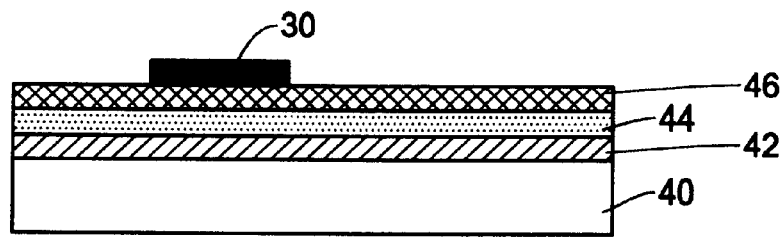
Figure 3J:
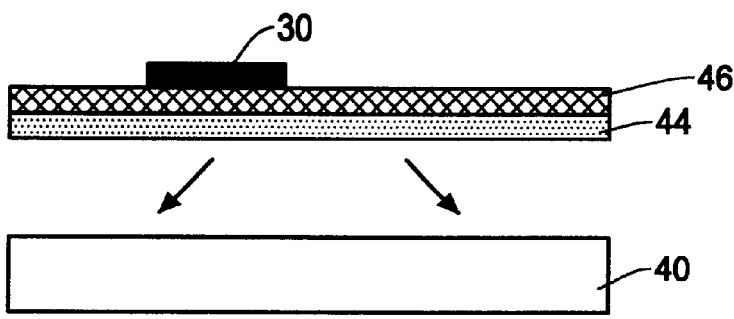
Figure 3K:
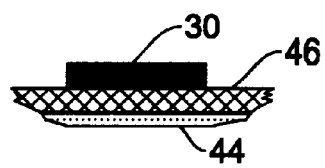
Figure 3L:
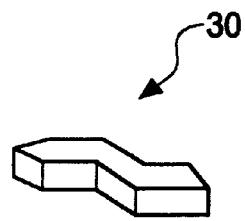

In the next process, the photoresist layer 48 is removed in a resist stripping process as shown in FIG. 3I. Typically, the resist layer 48 is removed by wet chemical processing. Other examples are acetone-based stripping and plasma $O_2$ stripping. In FIG. 3J, the sacrificial layer 42 is etched away so that the contact structure 30 is separated from the silicon substrate 40. Another etching process is conducted so that the adhesion promoter layer 44 and the conductive layer 46 are removed from the contact structure 30 as shown in FIG. 3K.

The etching material can be selected to etch the layers 44 and 46 but do not etch the contact structure 30. In other words, to etch the conductive layer 46 without etching the contact structure 30, as noted above, the conductive material used for the contact structure 30 must be different from the material of the conductive layer. Finally, the contact structure 30 is separated from any other materials as shown in the perspective view of FIG. 3L. Although the production process in FIGS. 3A–3L shows only one contact structure, in an actual production process, as shown in FIGS. 1A and 1B, a large number of contact structures are produced at the same time.

Figure 4:
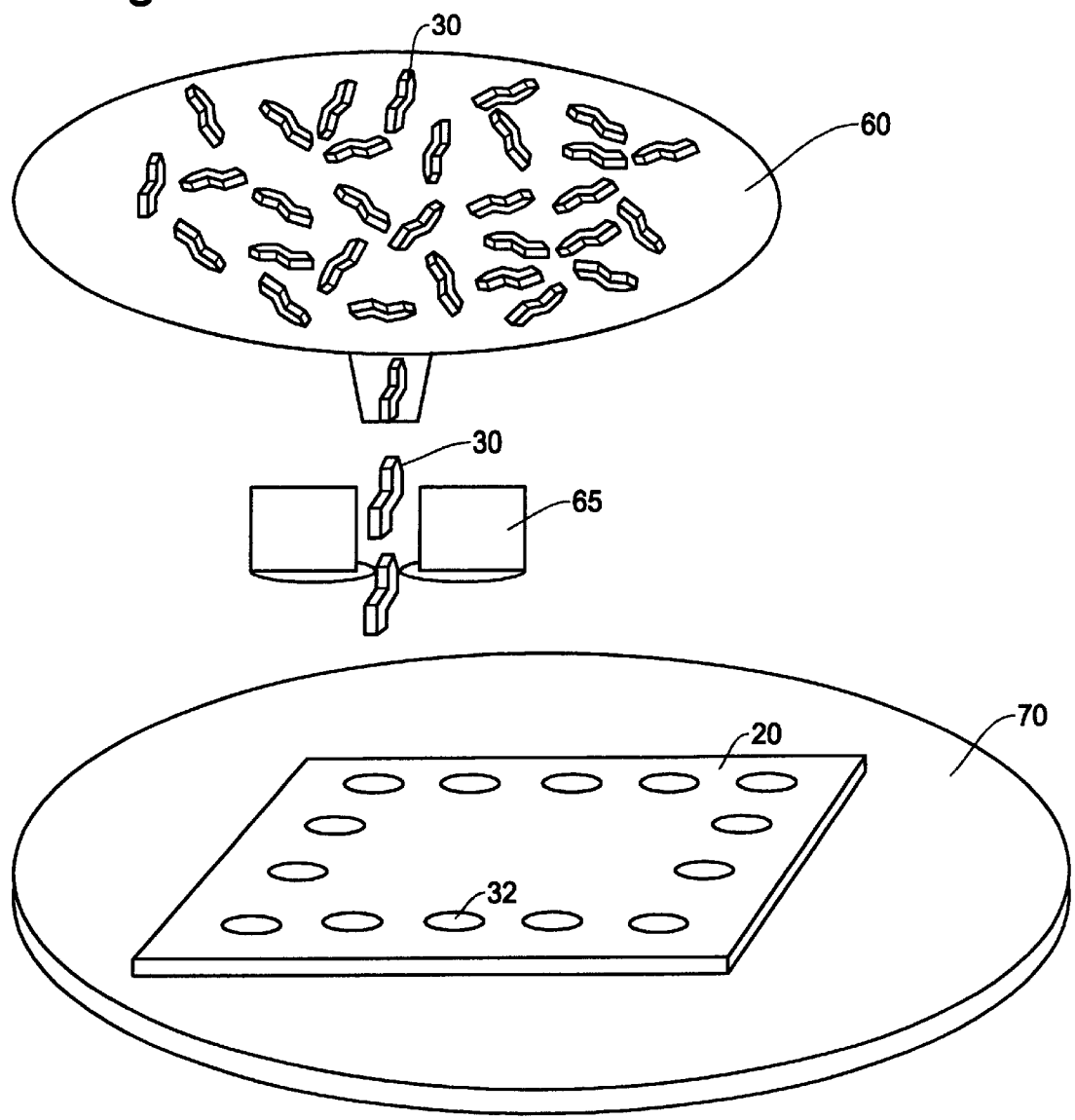
FIG. 4 is a schematic diagram showing a process of picking the contact structures and placing the same on a substrate such as a probe card.

FIG. 4 is a schematic diagram showing a process of picking the contact structures and placing the same on a contact substrate such as a probe card. A container 60 stores the contact structures 30 therein and provides the contact structures to a pick and place mechanism 65. Either the container 60 or the pick and place mechanism 65 may include an alignment capability so that the pick and place mechanism 65 grabs the contact structure in the same position and orientation. A probe card 20 having bonding pads 32 is placed on an X-Y table 70. The X-Y table 70 is able to fine adjust the position of the probe card 20 in X and Y directions as well as a vertical direction so that the pick and place mechanism 65 can place the contact structures 30 accurately on the corresponding bonding pads 32.

Figure 5:
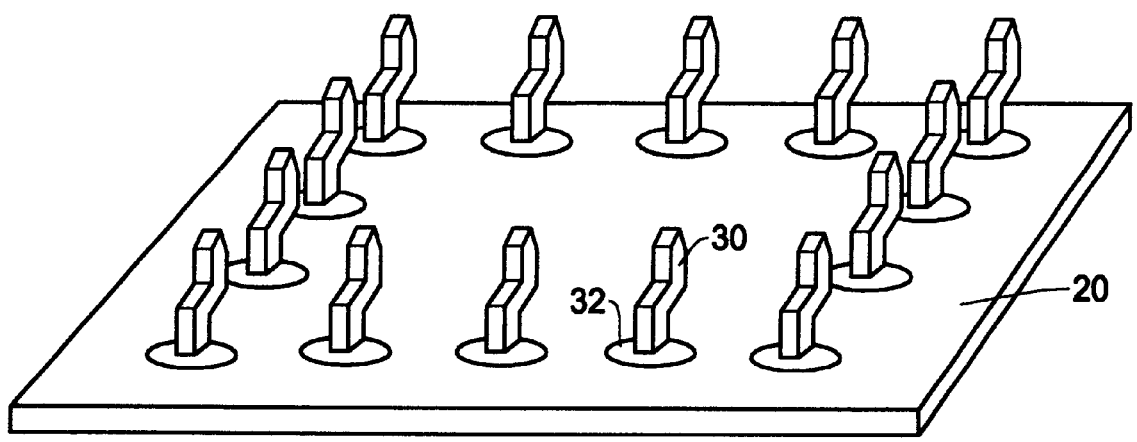
FIG. 5 is a perspective view showing an example of contact mechanism such as a contact probe having the contact structures produced by the process of the present invention.
Figure 6D:
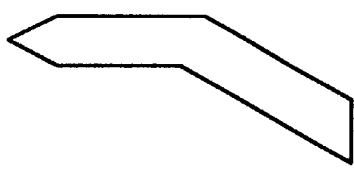
FIGS. 6A–6F are schematic diagrams showing examples of shape of contact structures to be produced through the production process of the present invention.
Figure 6C:
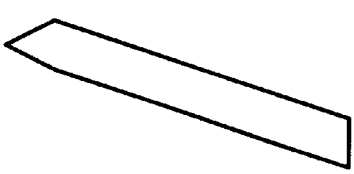
Figure 6B:
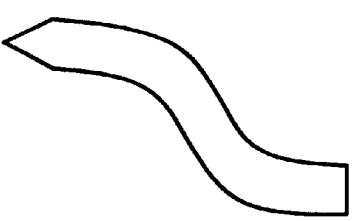
Figure 6A:
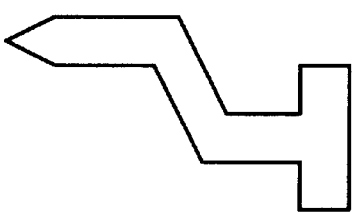
Figure 6F:
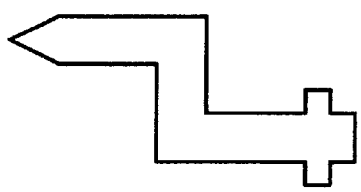
Figure 6E:
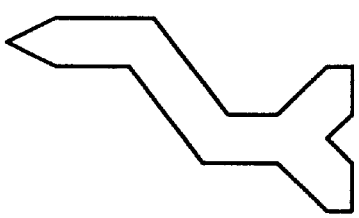

FIG. 5 is a perspective view showing an example of contact mechanism such as a contact probe having the contact structures produced in the present invention. Each of the contact structures 30 is attached to the surface of the bonding pad by bonding. Examples of bonding technology include brazing, ultrasonic welding, conductive adhesive, soldering, and micro welding.

FIGS. 6A–6F are schematic diagrams showing examples of shape of contact structures to be produced through the production process of the present invention. FIGS. 6A–6F merely show examples and are not exhaustive, and thus, other shapes of contact structures are also feasible. When mounted on a contact mechanism such as a probe card made of printed circuit board, and pressed against the contact targets such as contact pads on a semiconductor wafer to be tested, the contact structures in FIGS. 6A–6F exhibit contact force by spring effects and can produce scrubbing effects against the surface of the contact targets, depending on the target metallurgy of contact.

According to the present invention, the production process is able to produce a large number of contact structures in a horizontal direction on the silicon substrate by using relatively simple technique. Such contact structures produced are removed from the substrate and mounted on a contact mechanism such as a probe card in a vertical direction. The contact structures produced by the present invention are low cost and high efficiency and have high mechanical strength and reliability. The contact structures produced by the method of the present invention are advantageously applied in testing a semiconductor wafer, packaged LSI and the like including burn-in testing.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A method for producing contact structures, comprising the following steps of:
   forming a sacrificial layer on a surface of a silicon substrate;
   forming a photoresist layer on the sacrificial layer;
   aligning a photo mask over the photoresist layer and exposing the photoresist layer with ultraviolet light through the photo mask, the photo mask including an image of the contact structures;
   developing the image on the photoresist layer;
   forming the contact structures by depositing conductive material on the photoresist layer; and
   removing the sacrificial layer and the photoresist layer to separate the contact structures from the silicon substrate;
   wherein each of the contact structures is formed on a planar surface of the silicon substrate in an orientation parallel with the planar surface through the foregoing steps and is then changed the orientation and mounted on a contact substrate in a direction perpendicular to a surface of the contact substrate; and
   wherein each of the contact structures is formed of a base beam which is attached to the surface of the contact substrate in perpendicular to the surface of the contact substrate, a horizontal beam which is oriented in a horizontal direction and is integrally formed on a top of the base beam at one end, and a top beam which is integrally formed on another end of the horizontal beam and is oriented in a vertical direction, thereby producing a spring contact force when the contact structure is pressed against a contact target.

2. A method for producing contact structures as defined in claim 1, in the step of aligning and exposing, the photoresist layer is exposed by an electron beam or X-ray through the photo mask.

3. A method for producing contact structures as defined in claim 1, in the step of aligning and exposing, the photoresist layer is directly exposed by an electron beam, X-ray or laser light to define the image of the contact structure thereon.

4. A method for producing contact structures as defined in claim 1, further including a step of planarizing surfaces of the contact structures after the step of depositing the conductive material.

5. A method for producing contact structures as defined in claim 1, wherein the sacrificial layer is made of silicon dioxide.

6. A method for producing contact structures as defined in claim 1, wherein the conductive material forming the contact structures is made of copper (Cu), nickel (Ni), aluminum (Al), rhodium (Rh), palladium (Pd) or tungsten (W).

7. A method for producing contact structures as defined in claim 1, further including a step of forming a conductive layer made of conductive material on the sacrificial layer, and a step of forming an adhesion promoter layer between the sacrificial layer and the conductive layer.

8. A method for producing contact structures as defined in claim 7, wherein the conductive material forming the conductive layer is different from the conductive material forming the contact structures.

9. A method for producing contact structures as defined in claim 7, wherein the adhesion promoter layer is made of chromium (Cr) or titanium (Ti).

10. A method for producing contact structures, comprising the following steps of:
    forming a sacrificial layer on a surface of a silicon substrate;
    forming the contact structures on the silicon substrate through a photolithography process, the contact structures being oriented in a direction parallel with a planar surface of the silicon substrate; and
    removing the contact structures from the silicon substrate;
    wherein the photolithography process includes steps of photoresist coating, masking, exposure, photoresist stripping and conductive material deposition; and
    wherein the contact structures separated from the silicon substrate are changed orientation thereof and mounted on a contact substrate in a direction perpendicular to a surface of the contact substrate; and
    wherein each of the contact structure is formed of a base portion beam which is attached to the surface of the contact substrate in perpendicular to the surface of the contact substrate, a horizontal portion beam which is formed on a top of the base portion beam at one end and is oriented in a horizontal direction, and a tip portion beam which is integrally formed on another end of the horizontal portion beam and is oriented in a vertical direction, thereby producing a spring contact force when the contact structure is pressed against a contact target.

11. A method for producing a contact mechanism having contact structures each of which is able to exhibit a spring force for establishing electrical contact with a contact target, comprising the following steps of:
    forming a sacrificial layer on a surface of a silicon substrate;
    forming the contact structures on the silicon substrate through a photolithography process including a step of depositing conductive material, the contact structures being oriented in a direction parallel with a planar surface of the silicon substrate;

removing the contact structures from the silicon substrate;

positioning either the contact mechanism having bonding locations or the contact structures for mounting the contact structures on the bonding locations; and picking at least one of the contact structures and changing the orientation of the contact structure and placing the contact structure on the bonding location of the contact mechanism in perpendicular to a surface of the contact mechanism;

wherein each of the contact structure is formed of a base portion beam which is attached to the bonding location of the contact mechanism in perpendicular to the surface of the contact mechanism, a horizontal portion beam which is integrally formed on a top of the base portion beam at one end thereof and is oriented in a horizonal direction, and a tip portion beam which is formed on another end of the horizontal portion beam and is oriented in the vertical direction, thereby producing a spring contact force when the contact structure is pressed against a contact target.

12. A method for producing a contact mechanism as defined in claim 11, wherein the sacrificial layer is made of silicon dioxide.

13. A method for producing a contact mechanism as defined in claim 11, wherein the conductive material forming the contact structures is made of copper (Cu), nickel (Ni), aluminum (Al), palladium (Pd) or tungsten (W).

14. A method for producing a contact mechanism as defined in claim 11, wherein the photolithography process includes steps of photoresist coating, masking, exposure, photoresist stripping and conductive material deposition.

15. A method for producing a contact mechanism as defined in claim 14, the photolithography process further including a step of planarizing surfaces of the contact structures after the step of depositing the conductive material.

16. A method for producing a contact mechanism as defined in claim 14, wherein the step of depositing the conductive material in the photolithography process is an electroplating process utilizing the conductive layer.

17. A method for producing a contact mechanism as defined in claim 11, further including a step of forming a conductive layer made of conductive material on the sacrificial layer, and a step of forming an adhesion promoter layer between the sacrificial layer and the conductive layer, wherein the adhesion promoter layer is made of chromium (Cr) or titanium (Ti).

18. A method for producing a contact mechanism as defined in claim 17, wherein the conductive layer is made of copper (Cu) or nickel (Ni).

19. A method for producing a contact mechanism as defined in claim 17, wherein the conductive material forming the conductive layer is different from the conductive material forming the contact structures.

* * * * *